July 2, 1968 E. H. HUGHES 3,391,384

LINE TERMINAL STRUCTURE

Filed Sept. 1, 1966

INVENTOR:
EDWARD H. HUGHES,

BY William S Wolfe
HIS ATTORNEY.

United States Patent Office 3,391,384
Patented July 2, 1968

3,391,384
LINE TERMINAL STRUCTURE

Edward H. Hughes, Utica, N.Y., assignor to General Electric Company, a corporation of New York
Filed Sept. 1, 1966, Ser. No. 576,719
4 Claims. (Cl. 339—196)

ABSTRACT OF THE DISCLOSURE

This invention relates to apparatus for electrically connecting a line terminal to a printed circuit board positioned within an enclosure. The printed circuit board has a contact associated therewith which is held in place by an abutment depending from the enclosure.

Figures 1, 2, 3, 4, 5:
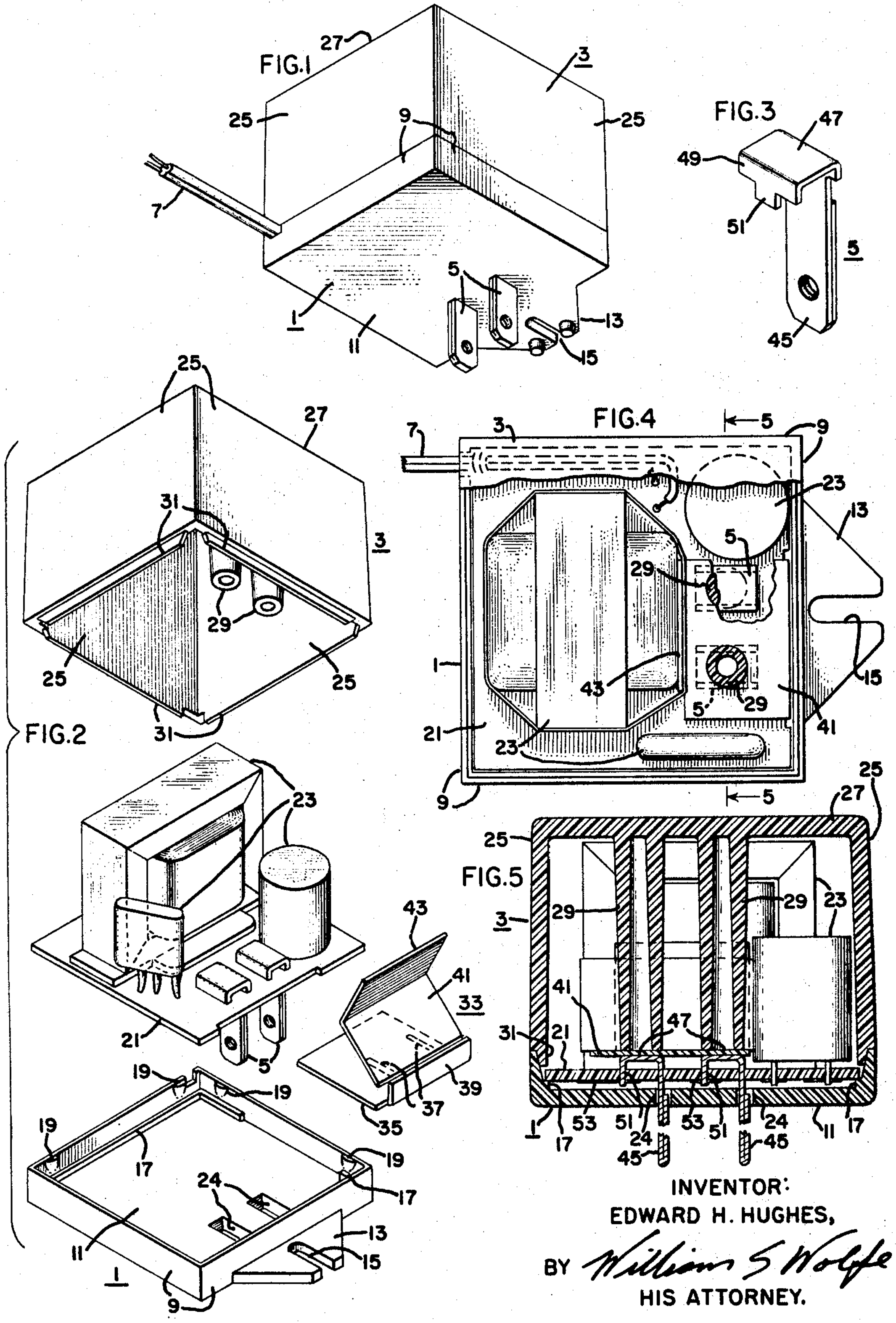

The present invention relates to line terminal structures and more specifically to a line terminal structure mounted to a printed circuit board.

It is desirable in many applications in electronic equipment to employ printed circuit boards for reasons of economy, size, and reliability. It is also necessary in many such applications to employ line terminals, such termials necessarily extending from the equipment. It has heretofore been impossible to mount the line terminals directly to the printed circuit board since the imparting of forces to the extending terminals by inadvertent dropping, etc., could easily result in damage to the printed circuit board. Thus, in the past terminal structures have been employed which are mechanically isolated from the printed circuit board, such isolation adding significantly to the cost and complexity of the device.

Accordingly, an object of the invention is to provide an improved line terminal structure for use with printed circiut boards.

Another object is to provide an improved line terminal structure which is directly affixed to the printed circuit board.

Yet another object is to provide an improved line terminal structure which is less complex and expensive than prior art devices.

These and other objects are achieved in one embodiment of the invention through the use of a line terminal having a first elongated leg adapted to be received by an aperture in a circuit board and a transverse portion extending from the first leg and terminating in a second portion overlying the first leg. The second leg portion includes a tab portion adapted to be received by a second aperture in the printed circuit board. The terminals are assembled to the printed circuit board, the board being received by a base member having apertures therein through which the terminals extend. A cover is provided including integral bosses which bear upon the transverse portion of the terminals when the cover is assembled to the base. In this manner, any forces exerted upon the terminals are transmitted to the bosses and damage to the printed circuit board is prevented.

The novel and distinctive features of the invention are set forth in the appended claims. The invention itself together with further objects and advantages thereof, may best be understood by reference to the accompanied drawings in which:

FIGURE 1 is a perspective view of an AC power converter employing the terminal structure of the invention, FIGURE 2 is an exploded perspective view of the AC power converter shown in FIGURE 1, FIGURE 3 is a detailed perspective view of the terminal structure shown in FIGURES 1 and 2, FIGURE 4 is a top view of the AC power converter shown in FIGURE 1, and FIGURE 5 is a sectional view taken along line 5—5 of FIGURE 4.

Referring to FIGURE 1, there is shown an AC power converter including a base portion generally shown at 1, a cover portion generally shown at 3, a line cord 7, and a pair of line terminals 5.

As shown in FIGURE 1, the base portion 1 comprises four side walls 9 and a bottom wall 11. A mounting tab 13 is provided including a slot 15 adapted to receive a screw for mounting the converter to a wall receptacle in a conventional fashion.

The base 1 is further provided with a plurality of mounting ribs 17 adapted to support a printed circuit board, a plurality of integral inwardly extending protuberances 19 also being provided.

As depicted, a printed circuit board 21 is provided having electrical components positioned thereon. The line terminals 5 are mounted to and extend from the printed circuit board 21, each line terminal 5 extending through an associated aperture 24 in the base portion 1.

The cover portion 3 comprises four side walls 25, and a top wall 27. The cover portion 3 is provided with first and second downwardly extending bosses 29 integrally formed with the top wall 27, the side walls 25 being provided with lip portions 31 as shown.

An insulating member 33 is provided which may be formed from a folded sheet of fish paper. The member comprises a bottom portion 35 including a pair of slots 37, each slot being adapted to receive one of the terminals 5. The insulating member further includes a transverse portion 39, and a top portion 41 overlying the bottom portion 35, the insulating member terminating in an upwardly extending portion 43 as shown. Thus as depicted, the insulating member 33 is adapted for positioning with the terminals 5 extending through the respective slots 37 and the top portion 41 overlying the terminals.

Referring to FIGURE 3, there is shown a detailed view of the terminals 5 shown in FIGURES 1 and 2. Each terminal 5 comprises an elongated leg portion 45 adapted to be received by an aperture in the printed circuit board 21 and a second leg portion 49 overlying the first leg portion 45, the second leg portion terminating in a tab portion 51 adapted to be received by a suitable aperture in the printed circuit board 21 and the two legs being joined by a transverse portion 47.

As shown in FIGURES 4 and 5, the terminals 5 are easily soldered to the printed circuit board 21 by conventional techniques such as dip soldering, the tabs 51 of the terminals 5 being soldered at 53 to the underside of the printed circuit board as shown most clearly in FIGURE 5.

The insulating member 33 is positioned with the leg portions 45 extending through the slots 37 and with the top portion 41 overlying the transverse portion 47 of each terminal 5. The printed circuit board is inserted in the base portion 1 so that the printed circuit board rests on the ribs 17 with the leg portions 45 of the terminals 5 extending through the apertures 24. The cover portion is positioned on the base portion with the lips 31 engaging the side walls 9 of the base portion as shown, the protuberances 19 insuring a tight fit between the base and cover. In this position, the bosses 29 abut the transverse portion 47 of each terminal with the top portion 41 of the insulating member 33 positioned therebetween.

In this fashion, the base portion can be sealed to the cover portion by, for example, electrosonic means to provide a rigid and compact assembly wherein any forces accidently imparted to the extending line terminals 5 are in turn imparted to the bosses 29 to preclude damage to the printed circuit board 21. An AC power converter constructed in accordance with the invention is found to easily satisfy the vigorous Underwriters' Laboratories drop tests.

Although the invention has been described with respect to certain specific embodiments, it will be appreciated that modifications and changes may be made by those skilled in the art without departing from the true spirit and scope of the invention.

What is claimed and desired to be secured by Letters Patent of the United States is:

1. Apparatus for mounting a line terminal to a printed circuit board positioned within an enclosure, said apparatus comprising:

(a) a terminal member having a first elongated leg portion, a second leg portion overlying said first leg portion in spaced relationship thereto and a transverse portion extending between said first and second leg portions, (b) said first leg portion extending through a first aperture in the printed circuit board and an aperture in the enclosure with said second leg portion extending through a second aperture in the printed circuit board, and said transverse portion overlying a first side of the printed circuit board, and (c) the enclosure being provided with a boss abutting the transverse portion of said terminal member.

2. The apparatus defined in claim 1 wherein the enclosure comprises a base portion and a cover portion, said first leg portion of said terminal member extending through an aperture in the base portion and the boss extending from the cover portion.

3. The apparatus defined in claim 1 including an insulating member overlying said transverse portion of said terminal member intermediate said transverse portion and the boss, said insulating member further including a portion overlying a second side of the printed circuit board and having an aperture therein receiving said first leg portion of said terminal member.

4. The apparatus defined in claim 1 including first and second spaced terminal members adapted to be received by a conventional wall socket.

References Cited

UNITED STATES PATENTS

| | | | |
|---|---|---|---|
| 2,847,559 | 8/1958 | Harrington et al. | 200—167 X |
| 3,123,686 | 3/1964 | Leichsenring | 200—51 |

MARVIN A. CHAMPION, *Primary Examiner.*

J. R. MOSES, *Assistant Examiner.*